(12) United States Patent
Fukase et al.

(10) Patent No.: US 6,261,897 B1
(45) Date of Patent: Jul. 17, 2001

(54) METHOD OF MANUFACTURING A SEMICONDUCTOR DEVICE

(75) Inventors: Tadashi Fukase; Masahiro Komuro, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/311,530

(22) Filed: May 13, 1999

(30) Foreign Application Priority Data

May 13, 1998 (JP) .................................................. 10-130451

(51) Int. Cl.$^7$ ............................................. H01L 21/8242
(52) U.S. Cl. ............................................................ 438/241
(58) Field of Search ....................................... 438/241, 233, 438/238, 258, 259, 396, 397, 399, 637, 641

(56) References Cited

U.S. PATENT DOCUMENTS 5,946,570 * 8/1999 Kasai et al. ........................... 438/253

FOREIGN PATENT DOCUMENTS

| 3-174766 | 7/1991 | (JP) . |
| 3-295269 | 12/1991 | (JP) . |
| 4-094163 | 3/1992 | (JP) . |
| 5-160067 | 6/1993 | (JP) . |
| 10-154800 | 6/1998 | (JP) . |
| 10-270656 | 10/1998 | (JP) . |
| 11-251556 | 9/1999 | (JP) . |

OTHER PUBLICATIONS

Proc. IEEE 1996, H. Koga, et al., entitled "A0.23um2 Double Self–Aligned Contact Cell of Gigabit DRAMS With a G–Added Vertical Epitaxial Si Pad", IEDM 96, pp. 589–592 in Figs. 3A through 3C.

* cited by examiner

Primary Examiner—David Nelms
Assistant Examiner—Quoc Huang
(74) Attorney, Agent, or Firm—Scully, Scott, Murphy & Presser

(57) ABSTRACT

In a method of manufacturing a semiconductor device, MOS transistors are formed on a semiconductor substrate. Each of the MOS transistors includes impurity diffusion regions and a gate electrode. A first interlayer insulating film is deposited over the MOS transistors. Contact holes are opened in the first interlayer insulating film so as to reach the impurity diffusion regions. A conductor is deposited on an entire surface of the semiconductor substrate. The deposited conductor is etched back in order to form contact plugs only in the contact holes. Pad portions are formed only on the contact plugs by the use of a selective growth method. A capacitor is formed over the semiconductor substrate so as to be connected to the pad potions via capacitor contacts.

26 Claims, 7 Drawing Sheets

PERIPHERAL CIRCUIT PORTION MEMORY CELL PORTION

PERIPHERAL CIRCUIT PORTION            MEMORY CELL PORTION

PERIPHERAL CIRCUIT PORTION

MEMORY CELL PORTION

METHOD OF MANUFACTURING A SEMICONDUCTOR DEVICE

BACKGROUND OF THE INVENTION

This invention relates to a method of manufacturing a semiconductor device, such as, a DRAM (Dynamic Random Access Memory).

A DRAM (Dynamic Random Access Memory) generally includes a memory cell array in which a plurality of memory cell portions are arranged in a matrix form. Each of the memory cell portions is composed of a pair of memory cells. Herein, each of memory cells is structured by one selection MOS transistor (Metal Oxide Semiconductor) and one capacitor for storing electric charge.

In this case, the selection MOS transistor has a source region, a drain region and a gate electrode. With this structure, the source region or the drain region is coupled to the capacitor. Further, the gate electrodes of the MOS transistors constitute the respective word lines in each memory cell portion.

Moreover, the source region or the drain region is coupled to a bit line. Herein, it is to be noted that the source region or the drain region is formed as a diffusion layer in a semiconductor substrate.

Recently, the semiconductor device has been largely reduced in both size and integration. Consequently, the semiconductor device, in which design minimum dimension of a space between wiring lines is less than 0.2 μm, has been fabricated.

The DRAM having capacity of 1 Gb has been manufactured by the use of such a fine processing technique. In such a DRAM, the known COB (Capacitor over Bit-line) structure has been often adopted in order to obtain high storing capacitance of the capacitor in a limited area. In this event, the capacitor is placed over the bit line in the COB structure.

Herein, disclosure has been made about the above-mentioned COB structure in Japanese Unexamined Patent Publication (JP-A) No. Hei. 3-174766, as illustrated in FIG. 1.

In FIG. 1, a plurality of word lines 4 are arranged in a vertical direction while a plurality of bit lines 10 are arranged in a parallel direction. In this case, the word lines 4 and the bit lines 10 are crossed to each other. In this event, each of the word lines 4 is composed of the gate electrode while each of the bit lines 10 is composed of the source region or the drain region, as mentioned before.

In such a DRAM of the COB structure, capacitor contacts 11 are placed between adjacent word lines 4, as illustrated in FIG. 1. The capacitor is connected to one of the source region and the drain region via the capacitor contact 11. On the other hand, the bit line 10 is connected to another one of the source region and the drain region via a bit contact 9.

Herein, it is to be noted that the reference numeral 3 denotes an impurity diffusion region which forms the source region or the drain region placed in the semiconductor substrate.

However, when the space between the wiring lines (namely, the space between the word lines 4) has been reduced, alignment margin becomes small.

In consequence, insulation between the wiring line (word line) 4 and the capacitor contact 11 can not be sufficiently ensured. To this end, a variety of methods have been adopted to ensure the insulation between the wiring line and the contact.

In FIG. 1, a connection pad 16 is arranged for each of the source region and the drain region. Thereby, the alignment margin between the word line (gate electrode) 4 and the capacitor contact 11 becomes large.

Subsequently, description has been made about a method of fabricating the connection pad 16 in FIGS. 2A through 2C. Herein, this method is also disclosed in above-mentioned Japanese Unexamined Patent Publication (JP-A) No. Hei. 3-174766.

Device isolation oxide films 2 and selection MOS transistors are first formed in a semiconductor substrate 1, as illustrated in FIG. 2A. In this event, each of the MOS transistors includes impurity diffusion regions 3 (source regions and drain a regions) which are formed in the semiconductor substrate 1, a gate electrode (word line) 4 which is formed via a gate insulating film between the source region and the drain region, and an insulating film 5 which covers the gate insulating film and the gate electrode 4.

In this state, an interlayer insulating film 6 is deposited on the semiconductor substrate 1. Thereafter, contact holes 7 are opened in the interlayer insulating film 6 in order to reach the impurity diffusion regions 3 as the source region and the drain region.

In this case, the contact holes 7 are opened by the use of the known self-alignment process so as to be electrically insulated from the gate electrode 4.

Subsequently, the connection pads 16 are selectively grown in only the contact holes 7, as shown in FIG. 2B. Herein, it is to be noted that the connection pad 16 is formed by, for example, polysilicon or single crystal silicon.

In this time, the polysilicon is grown to a depth of the contact hole 7 or more. Thereby, the polysilicon overflows from the contact hole 7. As a result, a diameter of the upper portion of the connection pad 16 exceeds that of the contact hole 7.

Thereafter, an interlayer insulating film 6' is deposited thereon, as illustrated in FIG. 2C. Successively, contact holes, which reach the upper portions of the connection pads 16, opened.

Subsequently, the bit contact 9, the bit line 10 which is connected to the bit contact 9, and the capacitor contacts 11 are sequentially formed. Further, the capacitor, which is connected to the capacitor contacts 11, is formed so as to complete the DRAM.

In this event, the capacitor includes a capacitor lower portion electrode 12 which is connected to the capacitor contacts 11, a capacitor upper portion electrode 13, and an insulating film which is formed between the capacitor lower electrode 12 and the capacitor upper portion electrode 13.

In this method, an upper surface of the connection pad 16 becomes large. In consequence, the alignment margin for the gate electrode 4 also becomes high during opening the contact holes for forming bit contact 9 and the capacitor contact 11.

Next, description is made about another method of fabricating a connection pad as disclosed in Proc. IEEE 1996, H. Koga et. al., titled "A 0.23 μm² Double Self-Aligned Contact Cell for Gigabit DRAMs With a Ge-Added Vertical Epitaxial Si Pad", IEDM 96, pp. 589–592 in FIGS. 3A through 3C.

Device isolation oxide films 2 and selection MOS transistors are first formed on a semiconductor substrate 1, as illustrated in FIG. 3A. In this event, each of the MOS transistors includes impurity diffusion regions 3 (source and drain regions) which are formed in the semiconductor substrate 1, and a gate electrode (word line) 4 which is formed via a gate insulating film between the source region and the drain region on the semiconductor substrate 1.

Further, an insulating film 5, such as, a silicon oxide film or a silicon nitride film are formed on an upper portion and a sidewall of the gate electrode 4. The insulating film 5, which covers the sidewall of the gate electrode 4, is formed by the use of the known anisotropic dry etching.

Immediately after the insulating films 5 are formed, the impurity diffusion regions 3 for forming the source region and the drain region of the MOS transistor are exposed for gate electrode 4 in the self-alignment manner.

Subsequently, for example, polysilicon is grown on only the silicon exposed portion (namely, the impurity diffusion region) to form a connection pad 16-2, as illustrated in FIG. 3B. In this event, no polysilicon is grown on the insulating film 5, such as, the silicon oxide film or the silicon nitride film.

The polysilicon is grown with two steps. Namely, the anisotropic epitaxial growth is performed in a first step so that the adjacent connection pads 16-2 do not contact to each other.

In a second step, when a height of the connection pad 16-2 exceeds a height of the gate electrode 4, isotropic growth is carried out so as to enlarge the upper surface of the connection pad 16-2 as illustrated in FIG. 3B.

Thereafter, an interlayer insulating film 6 is deposited thereon, as illustrated in FIG. 3C. Successively, contact holes, which reach the upper portions of the connection pads 16-2, opened.

Subsequently, the bit contact 9, the bit line 10 which is connected to the bit contact 9, and the capacitor contacts 11 are sequentially formed. Further, the capacitor, which is connected to the capacitor contacts 11, is formed to complete the DRAM.

In this event, the capacitor includes a capacitor lower portion electrode 12 which is connected to the capacitor contacts 11, a capacitor upper portion electrode 13, and an insulating film which is formed between the capacitor lower electrode 12 and the capacitor upper portion electrode 13.

The above-mentioned conventional methods have the following problems.

Namely, the silicon is selectively grown immediately after the contact hole 7 is opened in the method illustrated in FIG. 2. Consequently, the growth must be performed until the silicon overflows from the contact hole 7. As a result, duration for the selective growth becomes long.

In general, the selective growth of the silicon is carried out by utilizing difference of growth nucleus generation rate on the exposed surface. Under this circumstance, as the growth duration is longer, or a growth film thickness is thicker, selectivity of the growth becomes smaller.

Consequently, the adjacent connection pads 16 may contact to each other because the selectivity of the silicon growth is degraded in the method illustrated in FIG. 2.

Further, a complete clean surface of the silicon must be exposed on a bottom portion of the contact hole 7 in the above selective growth. However, it is difficult to obtain the complete clean surface on the bottom portion in fine contact hole 7 of 0.2 μm or less.

On the other hand, when alignment tolerance (or alignment deviation) occurs between a pattern of the impurity diffusion region 3 and a pattern of the gate electrode 4 in the method illustrated in FIG. 3, as shown in FIG. 4, one side of the contact pads 16-2, which are connected to the capacitor contact 11, w may not be sufficiently grown. This is because the impurity diffusion region 3 is not sufficiently exposed due to the alignment tolerance (or deviation) of the gate electrode 4, and growth rate of the silicon becomes slow.

Moreover, the recent gate electrode 4 is generally formed by the double structure of silicide, such as, tungsten silicide or titanium silicide and polysilicon to reduce resistance thereof.

With this structure, when the contact hole is opened on the gate electrode 4, the silicide is exposed on a bottom portion thereof. However, it is difficult to selectively grow the silicon on the silicide. Under this circumstance, it is impossible to form the connection pad on the gate electrode.

SUMMARY OF THE INVENTION

It is therefore an object of this invention to provide a method of manufacturing a semiconductor device which is capable of preventing insulation defect between adjacent connection pads during selective growth for forming the connection pads.

According to this invention, MOS transistors are formed on a semiconductor substrate. Each of the MOS transistors includes impurity diffusion regions and a gate electrode. Herein, the impurity diffusion regions serve as source and drain regions.

Further, a first interlayer insulating film is deposited over the MOS transistors. Contact holes are opened in the first interlayer insulating film so as to reach the impurity diffusion regions.

Next, a conductor is deposited on an entire surface of the semiconductor substrate. Successively, the deposited conductor is etched back in order to form contact plugs only in the contact holes. Moreover, pad portions are formed only on the contact plugs by the use of a selective growth method.

Finally, a capacitor is formed over the semiconductor substrate so as to be connected to the pad potions via capacitor contacts.

In this case, each of the contact plugs has a first diameter while each of the pad portions has a second diameter. Herein, the second diameter exceeds the first diameter.

The pad portions are formed only on the contact plugs by the use of an isotropic selective growth method in order to enlarge the pad portions. In this event, the isotropic selective growth method comprises a chemical vapor deposition (CVD).

In this event, the contact holes are opened by the use of a self-alignment manner so as to be insulated from the gate electrodes.

Moreover, a second interlayer insulating film is deposited on the first interlayer insulating film. Herein, the contact plugs are formed in the second interlayer insulating film.

The capacitor includes a capacitor lower electrode, a capacitor upper electrode and an insulating film between the capacitor lower electrode and the capacitor upper electrode.

As mentioned before, the selective growth method is performed only during forming the pad portion. Consequently, duration of the selective growth becomes shorter.

Namely, the adjacent pad portions do not contact to each other because it is difficult that the selectivity of the growth is degraded or destroyed. In consequence, the defect due to electric short between connection pads can be reduced.

Further, the contact plug formed by the polysilicon is formed in advance, and the pad portion is selectively grown on the contact plug. Consequently, the impurity diffusion region and the pad portion for the gate electrode can be simultaneously formed independently of base material for forming the pad portion.

DESCRIPTION OF THE PREFERRED EMBODIMENTS (First Embodiment)

Referring to FIGS. 5A through 5D, description will be made about a first embodiment of this invention.

Figure 5A:
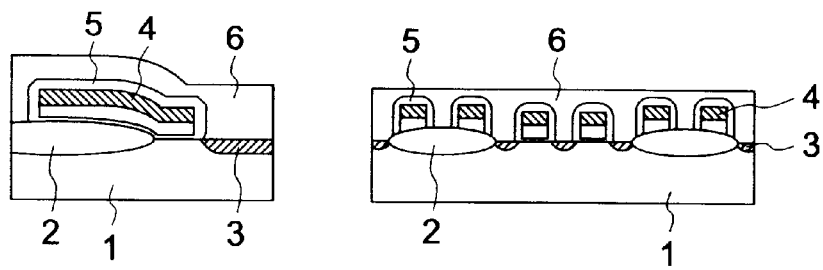
FIGS. 5A through 5D are cross sectional views for explaining a method of a semiconductor device according to a first embodiment of this invention.

Device isolation oxide films 2 and selection MOS transistors are first formed on a semiconductor substrate (a silicon substrate) 1, as illustrated in FIG. 5A. In this event, each of the MOS transistors includes impurity diffusion regions 3 (source and drain regions) which are formed in the semiconductor substrate 1, and a gate electrode (word line) 4 which is formed via a gate insulating film between the source region and the drain region on the semiconductor substrate 1.

In this event, the gate insulating film and the gate electrode 4 are covered with an insulating film 5, such as, a silicon oxide film or a silicon nitride film.

Subsequently, an interlayer insulating film 6, such as, a silicon oxide film (for example, a BPSG film) containing boron and phosphorus is deposited on an entire surface of the silicon substrate 1. Thereby, steps of the gate electrodes 4 are flattened, as illustrated in FIG. 5A.

Thereafter, contact holes 7, which reach the impurity diffusion regions 3 of the selection MOS transistor in the memory cell portion, are opened. In this event, the contact holes 7 are opened by the use of the self-alignment process so that electric insulation is kept for the gate electrodes 4.

Figure 1:
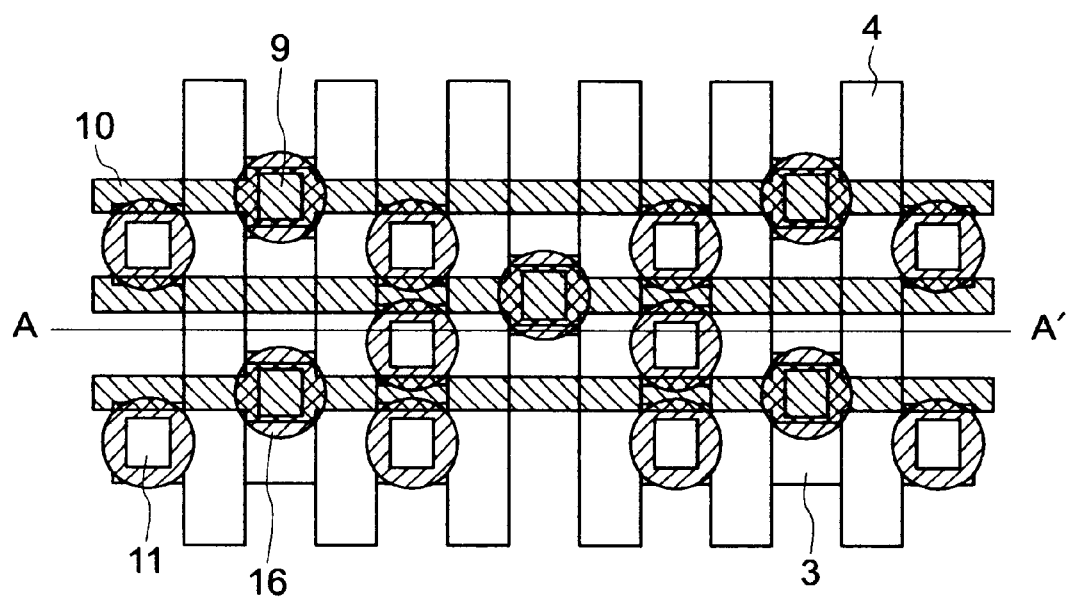
FIG. 1 is a plan view for explaining a method of manufacturing a conventional semiconductor device.
Figure 2A:
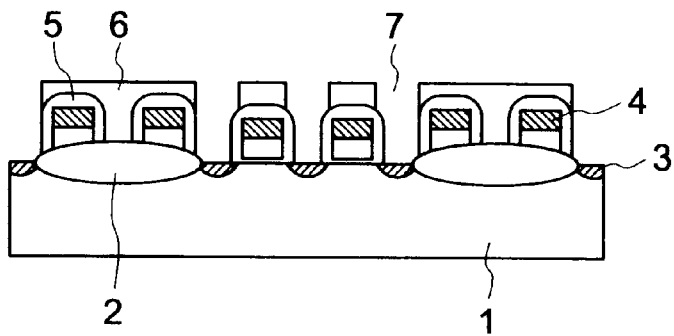
FIGS. 2A through 2C are cross sectional views for explaining the method of manufacturing the conventional semiconductor device illustrated in FIG. 1.
Figure 2B:
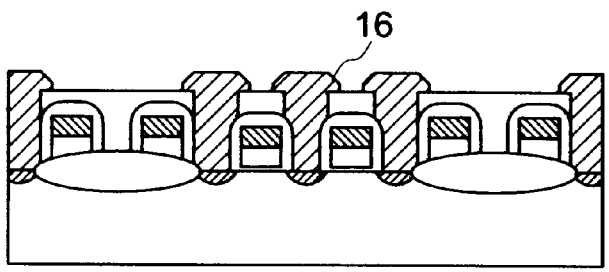
Figure 2C:
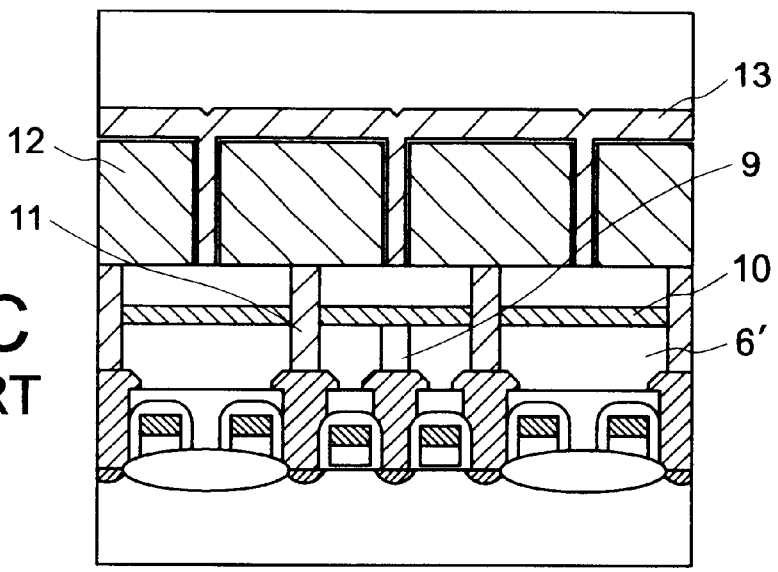
Figure 3A:
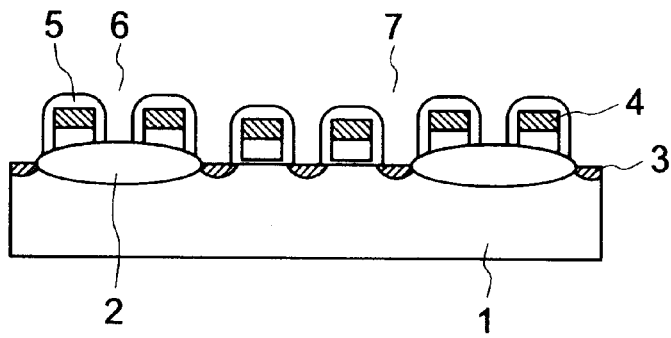
FIGS. 3A through 3C are cross sectional views for explaining a method of manufacturing another conventional semiconductor device.
Figure 3B:
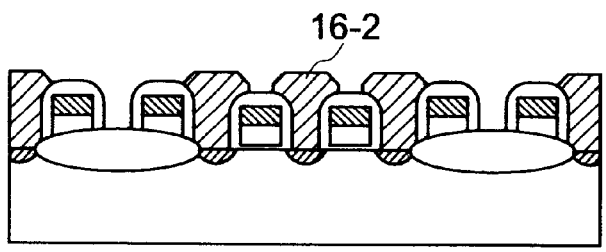
Figure 3C:
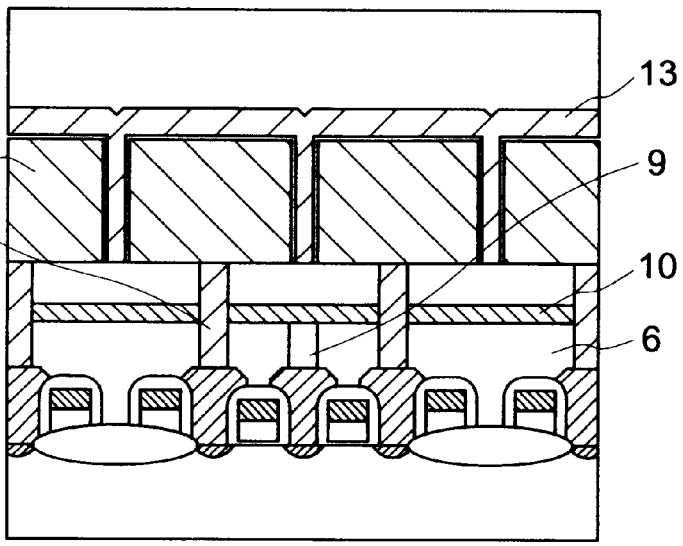
Figure 4:
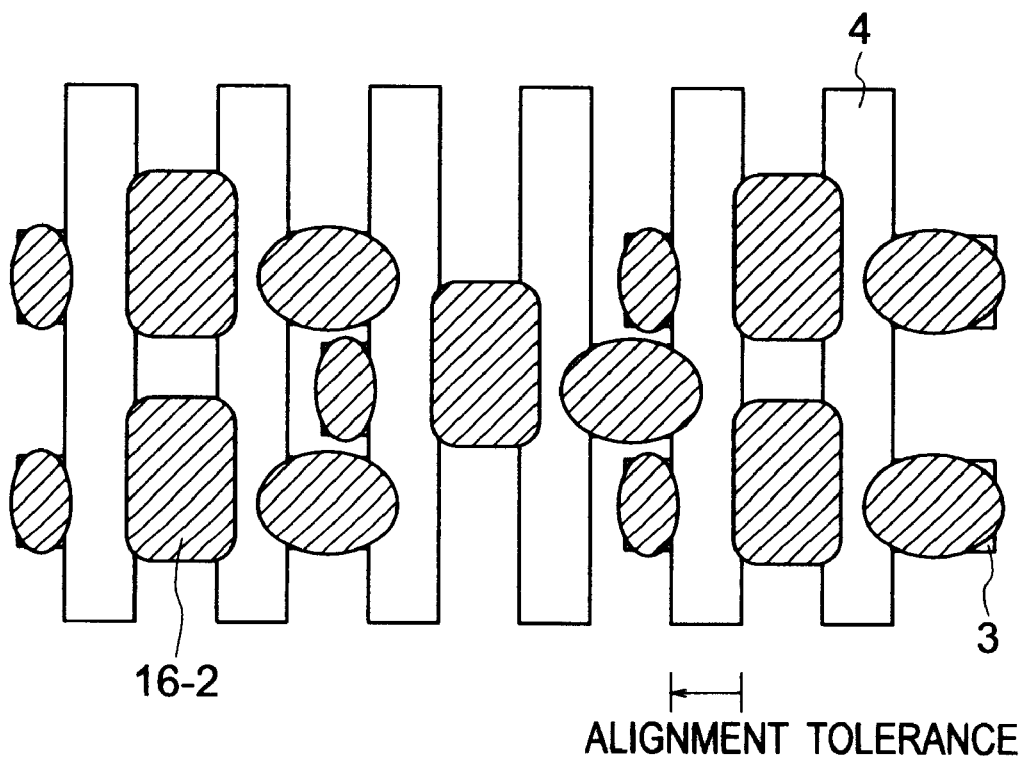
FIG. 4 is a plan view for explaining a problem of the another conventional semiconductor device illustrated in FIG. 3.

Successively, each of the contact holes 7 is buried with polysilicon containing impurity, such as, phosphorus. Herein, it is to be noted that the polysilicon is not deposited by the use of the selective growth illustrated in FIG. 2. The polysilicon is deposited on an entire surface of the substrate 1 in the first embodiment.

According to this method, it is unnecessary that the complete clean surface of the semiconductor substrate 1 is exposed on a bottom portion of the contact hole 7 in comparison with the selective growth method.

Figure 5B:
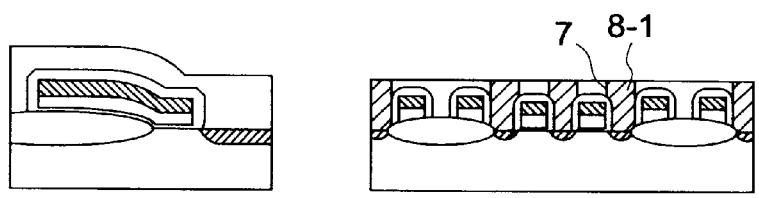

Thereafter, the etch-back process of the polysilicon is carried out. Thereby, contact plugs 8-1 consisting of the polysilicon are formed as a part of a connection pad in the memory cell portion, as illustrated in FIG. 5B.

Figure 5C:
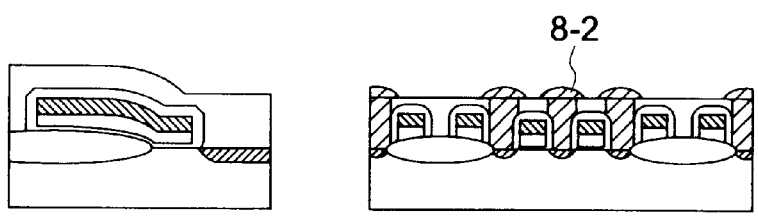

Subsequently, pad upper portions (pad portions) 8-2 of the connection pads are formed on the contact plugs 8-1 in the memory cell portion, as illustrated in FIG. 5C. In this case, the pad portions 8-2 are formed by the use of the selective growth method (for example, chemical vapor deposition (CVD)).

In this selective growth method, the polysilicon is grown only on the polysilicon, but the polysilicon is not grown on the interlayer insulating film 6, such as, the silicon oxide film (the BPSG film). Herein, it is to be noted that the connection pad is composed of the contact plug 8-1 and the pad upper portion (pad portion) 8-2.

In this case, the silicon is grown by the use of the isotropic growth. This isotropic growth is realized under the following condition. Namely, gas, such as, silane, disilane, and dichlorsilane and gas, such as, chlorine and bromine, are mixed under reduced pressure between 1 and 50 mtorr, and heat treatment is carried out at temperature between 600 and 900° C.

Thereby, a diameter of the pad portion 8-2 exceeds a diameter of the contact plug 8-1, as illustrated in FIG. 5C. In this event, it is possible that a space between the pad portions 8-2 is restricted to a limitation of fine process or less by suitably selecting a film thickness of the growth.

Figure 5D:
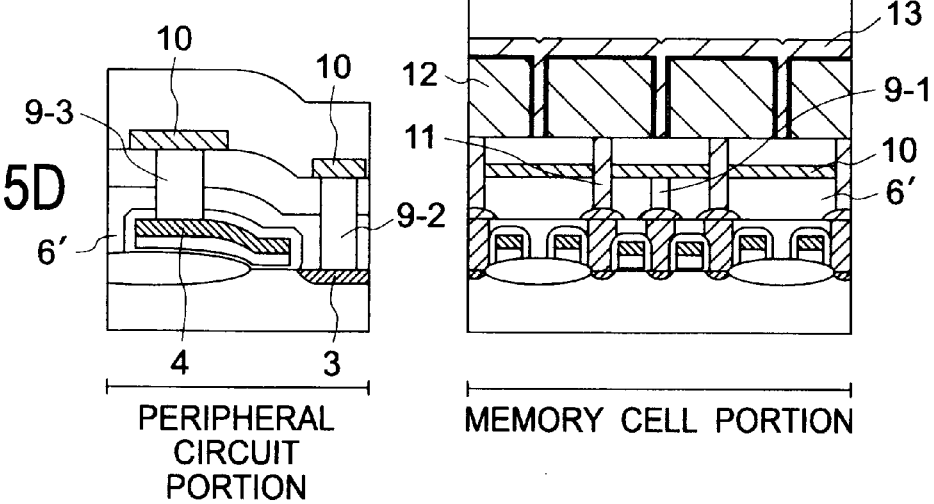

Thereafter, an interlayer insulating film 6' is deposited in the memory cell portion, as illustrated in FIG. 5D. Successively, contact holes, which reach the pad portions 8-2 of the connection pads, opened like FIG. 2C.

Subsequently, the bit contact 9-1, the bit line 10 which is connected to the bit contact 9-1, and the capacitor contacts 11 are sequentially formed. Further, the capacitor, which is connected to the capacitor contact 11, is formed to complete the DRAM.

In this event, the capacitor includes a capacitor lower portion electrode 12 which is connected to the capacitor contacts 11, a capacitor upper portion electrode 13, and an insulating film which is formed between the capacitor lower electrode 12 and the capacitor upper portion electrode 13.

On the other hand, the impurity diffusion region 3 and the gate electrode 4 are connected to the bit line 10 without the connection pad in the peripheral circuit portion, as illustrated in FIG. 5D.

(Second Embodiment)

Referring to FIGS. 6A through 6D, description will be made about a second embodiment of this invention.

In the second embodiment, the connection pads are formed in a peripheral circuit portion in addition to a memory cell portion different from the first embodiment.

Figure 6A:
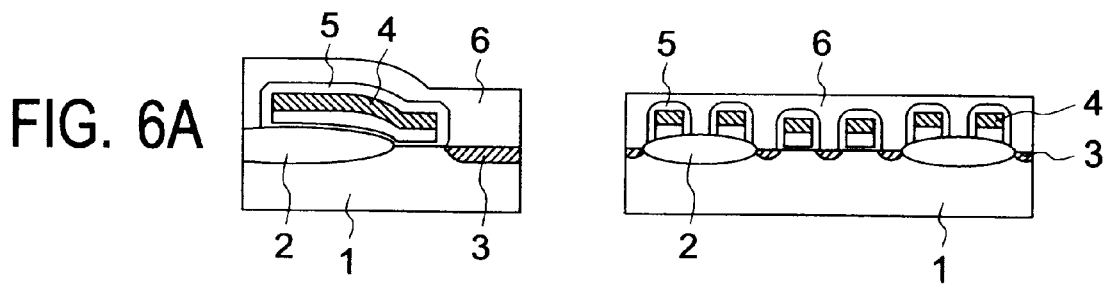
FIGS. 6A through 6D are cross sectional views for explaining a method of a semiconductor device according to a second embodiment of this invention.

After the device isolation oxide films 2 are formed on the semiconductor substrate 1 in the memory cell portion and the peripheral circuit portion, the gate electrodes 4 are formed in the memory cell portion and the peripheral circuit portion, as illustrated in FIG. 6A.

In this event, the gate electrodes 4 are covered with the insulating films 5 in the memory cell portion and the peripheral circuit portion. However, the gate electrode 4 may not be covered with the insulating film 5 in the peripheral circuit portion.

Subsequently, an interlayer insulating film 6, such as, a silicon oxide film (a BPSG film) containing boron and phosphorus is deposited on an entire surface of the silicon substrate 1. Thereby, steps of the gate electrodes 4 are flattened, as illustrated in FIG. 6A.

Figure 6B:
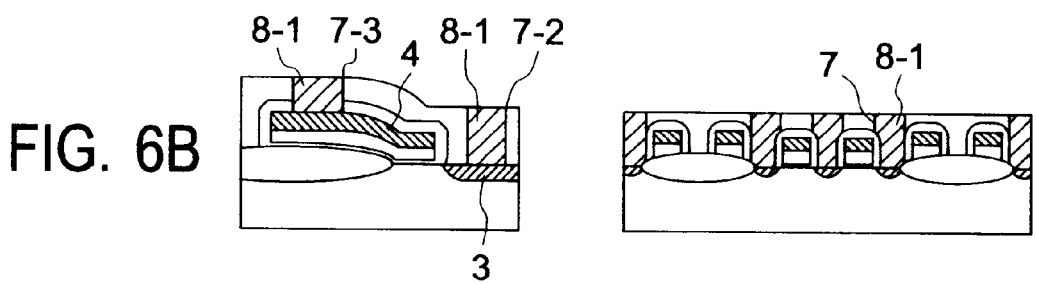

Thereafter, contact holes 7, which reach impurity diffusion regions 3 of a selection MOS transistor in the memory cell portion, are opened, as illustrated in FIG. 6B. Further, contact holes 7-2 and 7-3, which reach the impurity diffusion regions 3 and the gate electrode 4, are opened in the peripheral circuit portion. In this event, only the contact hole 7-2, which reaches the impurity diffusion region 3, may be opened in the peripheral circuit portion.

Successively, each of the contact holes 7, 7-2 and 7-3 is buried with polysilicon containing impurity, such as, phosphorus to form contact plugs 8-1 in the contact holes 7, 7-2, and 7-3.

In this case, the contact plug 8-1 consisting of the polysilicon is formed by depositing the polysilicon on an entire surface of the semiconductor substrate 1 and by etching back like the first embodiment.

Consequently, it is unnecessary that a complete clean surface of the semiconductor substrate 1 is exposed on a bottom portion of each contact hole 7, 7-2, and 7-3 in comparison with the selective growth method.

Further, metal, such as tungsten silicide and titanium silicide, may be exposed on the gate electrode 4 in the peripheral circuit portion.

Figure 6C:
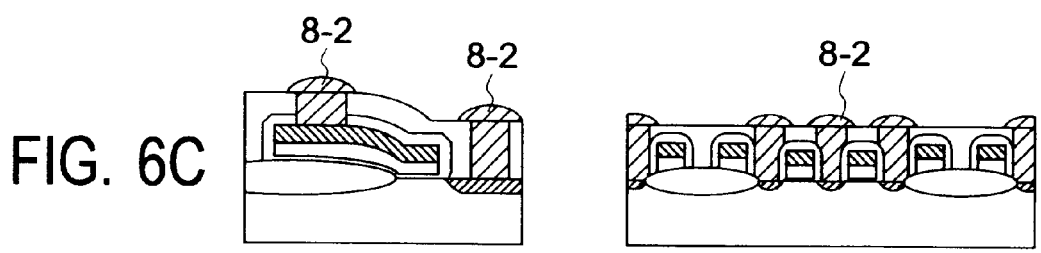

Subsequently, pad upper portions (pad portions) 8-2 of the connection pads are formed on the contact plugs 8-1 in the memory cell portion and in the peripheral circuit portion, as illustrated in FIG. 6C.

In this case, the pad portion 8-2 is formed by the use of the selective growth method (for example, CVD) like the first embodiment. In this selective growth method, the polysilicon is grown only on the polysilicon, but the polysilicon is not grown on the interlayer insulating film 6. The connection pad is composed of the contact plug 8-1 and the pad upper portion (pad portion) 8-2.

In this case, the silicon is grown by the use of the isotropic growth. Thereby, a diameter of the pad portion 8-2 exceeds a diameter of the contact plug 8-1, as illustrated in FIG. 6C.

In this event, the contact hole 7-3 is already buried with the polysilicon on the gate electrode 4 in the peripheral circuit portion on the condition that no silicide is exposed. In consequence, selectivity of the pad portion 82 is not degraded or destroyed.

Figure 6D:
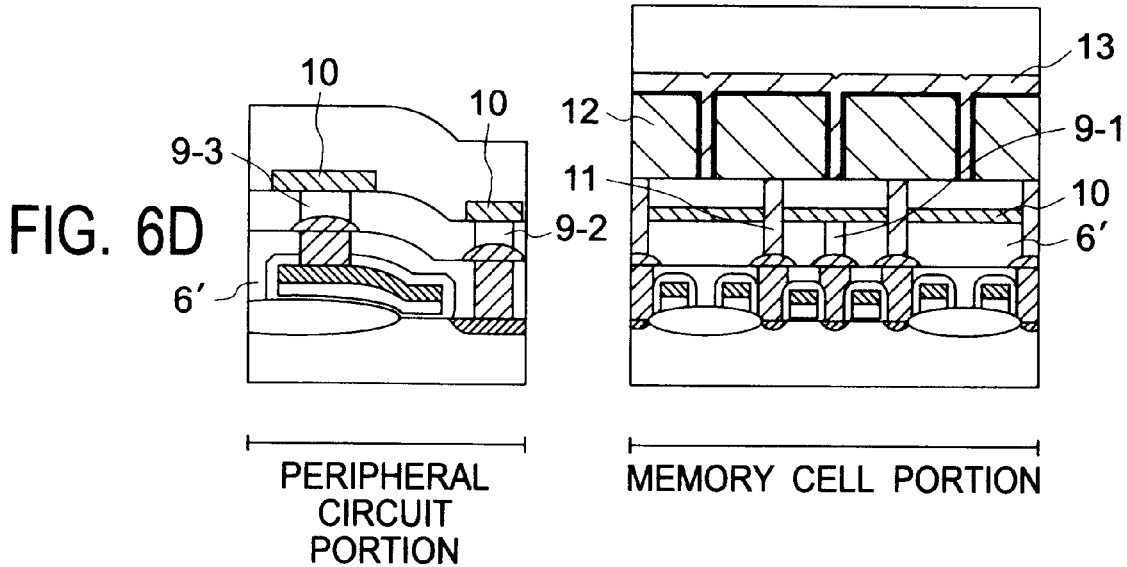

Thereafter, interlayer insulating films 6' are deposited in the memory cell portion and in the peripheral circuit portion, as illustrated in FIG. 6D. Successively, contact holes, which reach the pad portions 8-2 of the connection pads, opened like FIG. 5C.

Subsequently, the bit contacts 9-1, 9-2 and 9-3, the bit line 10, and the capacitor contact 11 are sequentially formed. Further, the capacitor, which is connected to the capacitor contacts 11, is formed to complete the DRAM.

In this event, the capacitor includes a capacitor lower portion electrode 12, a capacitor upper portion electrode 13, and an insulating film which is formed between the capacitor lower electrode 12 and the capacitor upper portion electrode 13.

As mentioned before, the connection pads are formed in the peripheral circuit portion in addition to the memory cell portion in the second embodiment. As a result, the alignment margin between the gate electrode 4 and the contact 9-3 becomes small in the peripheral circuit portion as compared to the first embodiment. Further, the chip can be reduced in total.

(Third Embodiment)

Referring to FIGS. 7A through 7D, description will be made about a third embodiment of this invention.

In the third embodiment, connection pad is formed only under capacitor contacts 11 different from the first and second embodiments.

Figures 7A, 7B, 7C, 7D:
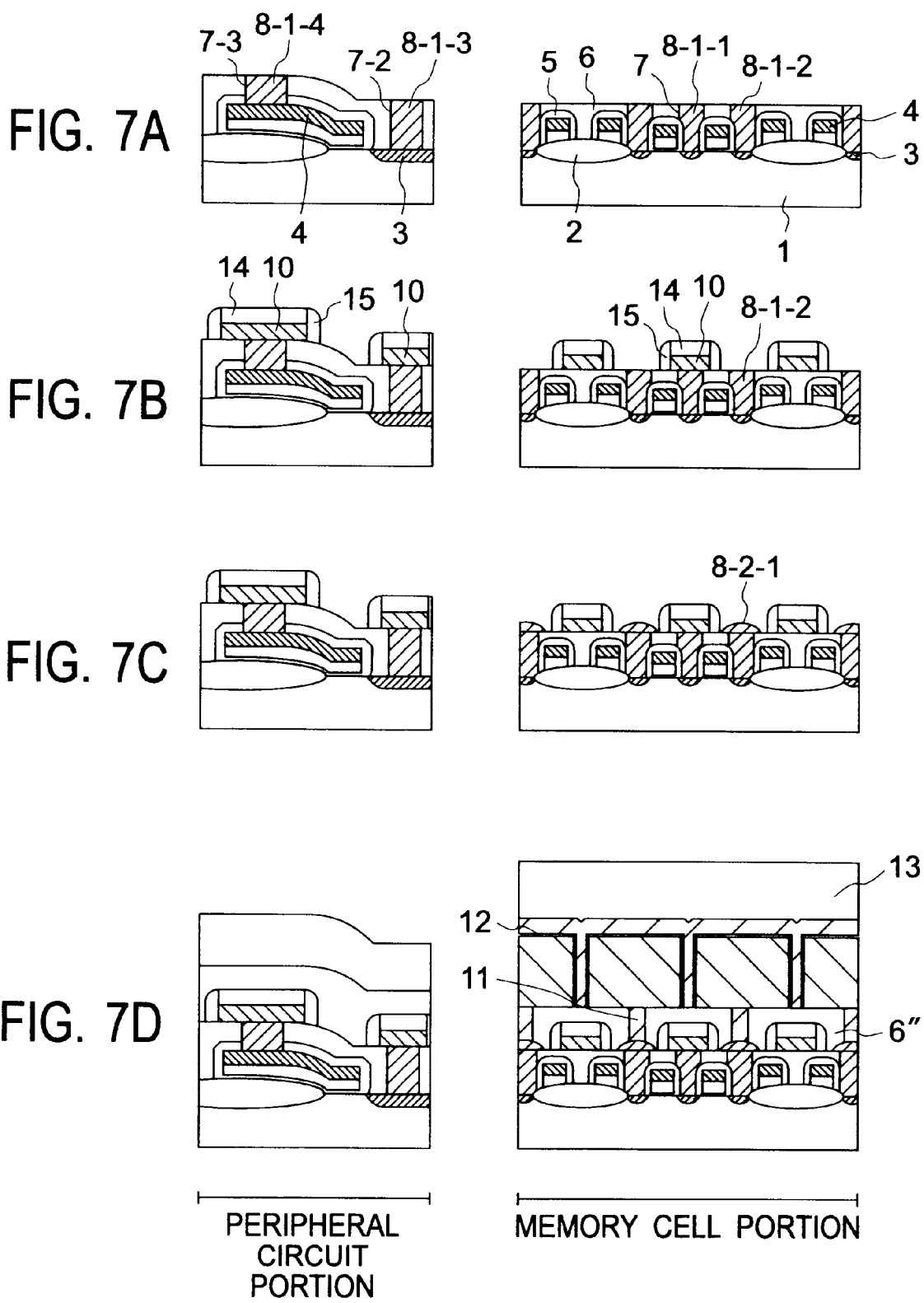
FIGS. 7A through 7D are cross sectional views for explaining a method of a semiconductor device according to a third embodiment of this invention.

Device isolation oxide films 2, gate electrodes 4, and an interlayer insulating film 6 are formed on a semiconductor substrate 1, as illustrated in FIG. 7A.

Further, contact plugs 8-1-1, 8-1-2 consisting of polysilicon are formed in a memory cell portion while contact plug 8-1-3, 8-1-4 consisting of polysilicon is formed in a peripheral circuit portion, like the second embodiment.

Subsequently, conductors are deposited, and insulating films are deposited thereon, as illustrated in FIG. 7B. In this event, the conductor forms a bit line 10 and is formed by tungsten asilicide or other suitable material. Further, the insulating film forms a cap insulating film 14, and is formed by a silicon oxide film or a silicon nitride film.

Next, the insulating film and the conductor are sequentially etched using a photoresist as a mask. Thereby, the bit line 10 with the cap insulating film 14 is formed on the substrate 1.

Subsequently, an insulating film, such as, a silicon oxide film or a silicon nitride film is deposited on an entire surface by the use of the CVD (Chemical Vapor Deposition) which is superior in step coverage.

Thereafter, the insulating film is etched back by the use of the anisotropic etching to form a sidewall insulating film 15 for the bit line 10. Herein, it is to be noted that the bit line 10 is illustrated in parallel to the gate electrode 4 for the better understanding in FIG. 7.

After the formation of the sidewall insulating film 15, only contact plug 8-1-2 consisting of the polysilicon is exposed between the bit lines 10 in the self-alignment manner under the capacitor contact 11. On the other hand, the contact plug 8-1-1 consisting of the polysilicon becomes a bit contact itself.

Successively, a pad upper portion (pad portion) 8-2-1 consisting of the polysilicon is formed on the contact plug 8-1-2 consisting of the polysilicon by using a method in which a polysilicon is grown only on the polysilicon, as illustrated in FIG. 7C.

In this case, the pad portion 8-2-1 is formed by the use of the isotropic growth method. Thereby, a diameter of the pad portion 8-2-1 exceeds a diameter of the contact plug 8-1-2, as illustrated in FIG. 7C.

Thereafter, an interlayer insulating film 6" is deposited, and a capacitor contact 11, a capacitor lower electrode 12, an insulating film, and a capacitor upper electrode 13 are formed to complete the DRAM.

In this case, the bit contact is formed when the contact plug 8-1-1 consisting of the polysilicon is formed in the third embodiment. In consequence, the number for opening the contacts is reduced with one time as compared to the first and second embodiments.

Although the descriptions have been made about the DRAM having the COB structure in which the capacitor is formed over the bit line in the first through third embodiments, this invention is not limited to the above-mentioned type DRAM, and can be applied for the other type DRAMs.

What is claimed is:

1. A method of manufacturing a semiconductor device having a semiconductor substrate, comprising the steps of:

forming MOS transistors on the semiconductor substrate, each of the MOS transistors including impurity diffusion regions and a gate electrode, the impurity diffusion regions serving as source and drain regions;

depositing a first interlayer insulating film over the MOS transistors;

opening contact holes in the first interlayer insulating film so as to reach the impurity diffusion regions;

depositing a conductor on an entire surface of the semiconductor substrate;

etching back the deposited conductor in order to form contact plugs only in the contact holes;

forming pad portions only on the contact plugs by the use of a selective growth method; and forming a capacitor over the semiconductor substrate so as to be connected to the pad potions via capacitor contacts.

2. A method as claimed in claim 1, wherein:

each of the contact plugs has a first diameter while each of the pad portions has a second diameter, the second diameter exceeding the first diameter.

3. A method as claimed in claim 1, wherein:

the pad portions are formed only on the contact plugs by the use of an isotropic selective growth method in order to enlarge the pad portions.

4. A method as claimed in claim 3, wherein:

the isotropic selective growth method comprises a chemical vapor deposition.

5. A method as claimed in claim 1, wherein:

the first interlayer insulating film is deposited so as to flatten steps of the gate electrodes.

6. A method as claimed in claim 1, wherein:

the first interlayer insulating film is formed by a silicon oxide film.

7. A method as claimed in claim 1, wherein:

the semiconductor device includes a memory cell portion, the MOS transistors being formed in the memory cell portion.

8. A method as claimed in claim 1, wherein:

the contact holes are opened by the use of a self-alignment manner so as to be insulated from the gate electrodes.

9. A method as claimed in claim 1, wherein:

the conductor comprises polysilicon.

10. A method as claimed in claim 1, wherein:

a second interlayer insulating film is deposited on the first interlayer insulating film, the contact plugs being formed in said second interlayer insulating film.

11. A method as claimed in claim 1, wherein:

a bit line is formed over said semiconductor substrate, the bit line being connected to the pad portion via a bit contact.

12. A method as claimed in claim 11, wherein:

the bit contact is formed in the second interlayer insulating film.

13. A method as claimed in claim 11, wherein:

the gate electrode serves as a word line, the bit line and the word line being crossed to each other.

14. A method as claimed in claim 1, wherein:

the capacitor includes a capacitor lower electrode, a capacitor upper electrode and an insulating film between the capacitor lower electrode and the capacitor upper electrode.

15. A method as claimed in claim 1, wherein:

the semiconductor device comprises a DRAM.

16. A method as claimed in claim 15, wherein:

the capacitor is formed over the bit line.

17. A method as claimed in claim 1, wherein:

the pad portions are formed only under the capacitor contacts.

18. A method as claimed in claim 17, wherein:

the bit line is directly connected to the contact plug.

19. A method of manufacturing a semiconductor device having a semiconductor substrate in a peripheral circuit portion, comprising the steps of:

forming a least one MOS transistor on the semiconductor substrate, the MOS transistors including an impurity diffusion region and a gate electrode;

depositing a first interlayer insulating film over the MOS transistor;

opening contact holes in the first interlayer insulating film so as to reach the impurity diffusion region and the gate electrode;

depositing a conductor on an entire surface of the semiconductor substrate;

etching back the deposited conductor in order to form contact plugs only in the contact holes;

forming pad portions only on the contact plugs by the use of a selective growth method; and forming a bit line over the semiconductor substrate so as to be connected to the pad potions via bit contacts.

20. A method as claimed in claim 19, wherein:

each of the contact plugs has a first diameter while each of the pad portions has a second diameter, the second diameter exceeding the first diameter.

21. A method as claimed in claim 19, wherein:

the pad portions are formed only on the contact plugs by the use of an isotropic selective growth method in order to enlarge the pad portions.

22. A method of as claimed in claim 21, wherein:

the isotropic selective growth method comprises a chemical vapor deposition.

23. A method as claimed in claim 19, wherein:

a second interlayer insulating film is deposited on the first interlayer insulating film, the contact plugs being formed in said second interlayer insulating film.

24. A method as claimed in claim 23, wherein:

the bit contact is formed in the second interlayer insulating film.

25. A method as claimed in claim 19, wherein:

the semiconductor device comprises a DRAM.

26. A method as claimed in claim 19, wherein:

the gate electrode has a silicide film on a surface thereof, the contact plug being formed on the silicide film.

* * * * *

UNITED STATES PATENT AND TRADEMARK OFFICE
CERTIFICATE OF CORRECTION

PATENT NO.   : 6,261,897 B1
DATED        : July 17, 2001
INVENTOR(S)  : Tadashi Fukase et al.

It is certified that error appears in the above-identified patent and that said Letters Patent is hereby corrected as shown below:

Column 3,
Line 67, delete "2"

Column 4,
Line 37, "potions" should read -- portions --

Column 9,
Line 4, "potions" should read -- portions --

Column 10,
Line 29, "potions" should read -- portions --

Signed and Sealed this

Eleventh Day of June, 2002

Attest:

JAMES E. ROGAN
Attesting Officer  Director of the United States Patent and Trademark Office